United States Patent
Chen et al.

(10) Patent No.: US 7,494,753 B2
(45) Date of Patent: Feb. 24, 2009

(54) METHOD, PROGRAM PRODUCT AND APPARATUS FOR IMPROVING CALIBRATION OF RESIST MODELS USED IN CRITICAL DIMENSION CALCULATION

(75) Inventors: Jang Fung Chen, Cupertino, CA (US); Gabriel Berger, Mill Valley, CA (US); Tamer Coskun, Cupertino, CA (US); Sangbong Park, Fremont, CA (US); Ting Chen, Chandler, AZ (US)

(73) Assignee: ASML Masktools B.V., Ah Veldhoven (NL)

( * ) Notice: Subject to any disclaimer, the term of this patent is extended or adjusted under 35 U.S.C. 154(b) by 631 days.

(21) Appl. No.: 11/339,827

(22) Filed: Jan. 26, 2006

(65) Prior Publication Data

US 2006/0208205 A1 Sep. 21, 2006

Related U.S. Application Data

(60) Provisional application No. 60/647,433, filed on Jan. 28, 2005.

(51) Int. Cl.
*G03F 9/00* (2006.01)
*G03C 5/00* (2006.01)

(52) U.S. Cl. .......................................... 430/30; 716/21
(58) Field of Classification Search ................... 430/30; 716/21
See application file for complete search history.

(56) References Cited

U.S. PATENT DOCUMENTS

| 2003/0008246 A1 | 1/2003 | Cheng et al. |
| 2004/0139420 A1 | 7/2004 | Brist et al. |
| 2006/0206551 A1 | 9/2006 | Grushin |

FOREIGN PATENT DOCUMENTS

WO WO 2004/059394 AW 7/2004

OTHER PUBLICATIONS

European Search Report, issued in European Patent Application No. 06250451.9-1226, dated on Nov. 8, 2007.
Brunner et al. "Impact of resist blur on MEF, OPC, and CD control", Optical Microlithography XVII, Proceedings of SPIE vol. 5377, pp. 141-149.
Byers et al. "Modeling Soft Bake Effects in Chemically Amplified Resists", Advances in Resist Technologies and Processing XX, Proceedings of SPIE vol. 5039, pp. 1143-1154.
Tollkhun et al. "Will Darwin's' Law Help us to Improve our resist models?", Proceedings of the SPIE, vol. 5039, 2 pages, Feb. 24-26, 2003.
First Office Action and English Translation dated Dec. 24, 2007 for Korean Patent Application No. 10-2006-0008649.
Austrian Patent Office Search Report dated Jan. 25, 2008 for Singapore Patent Application No. 200600560-7.
T. Brunner et al., "Impact of Resist Blur on MEF, OPC and CD Control", *Proceedings of SPIE*, vol. 5377, 2004, pp. 141-149.

*Primary Examiner*—Christopher G Young
(74) *Attorney, Agent, or Firm*—Pillsbury Winthrop Shaw Pittman LLP

(57) ABSTRACT

Improved calibration of a resist model used in critical dimension (CD) calculation is disclosed. A dose function is obtained based on optical tool to be used form the resist on a wafer. The dose function indicates the amount of energy in a resist. The dose function is convolved with a convolution kernel to obtain a modified dose function. The convolution kernel has variable diffusion lengths in different directions. The convolution kernel may include multiple Gaussian kernels each having variable diffusion lengths in different directions. The modified dose function is converted into a CD value which is compared with a target value. If necessary, the diffusion lengths of the Gaussian kernels are adjusted based on the comparison result.

15 Claims, 11 Drawing Sheets

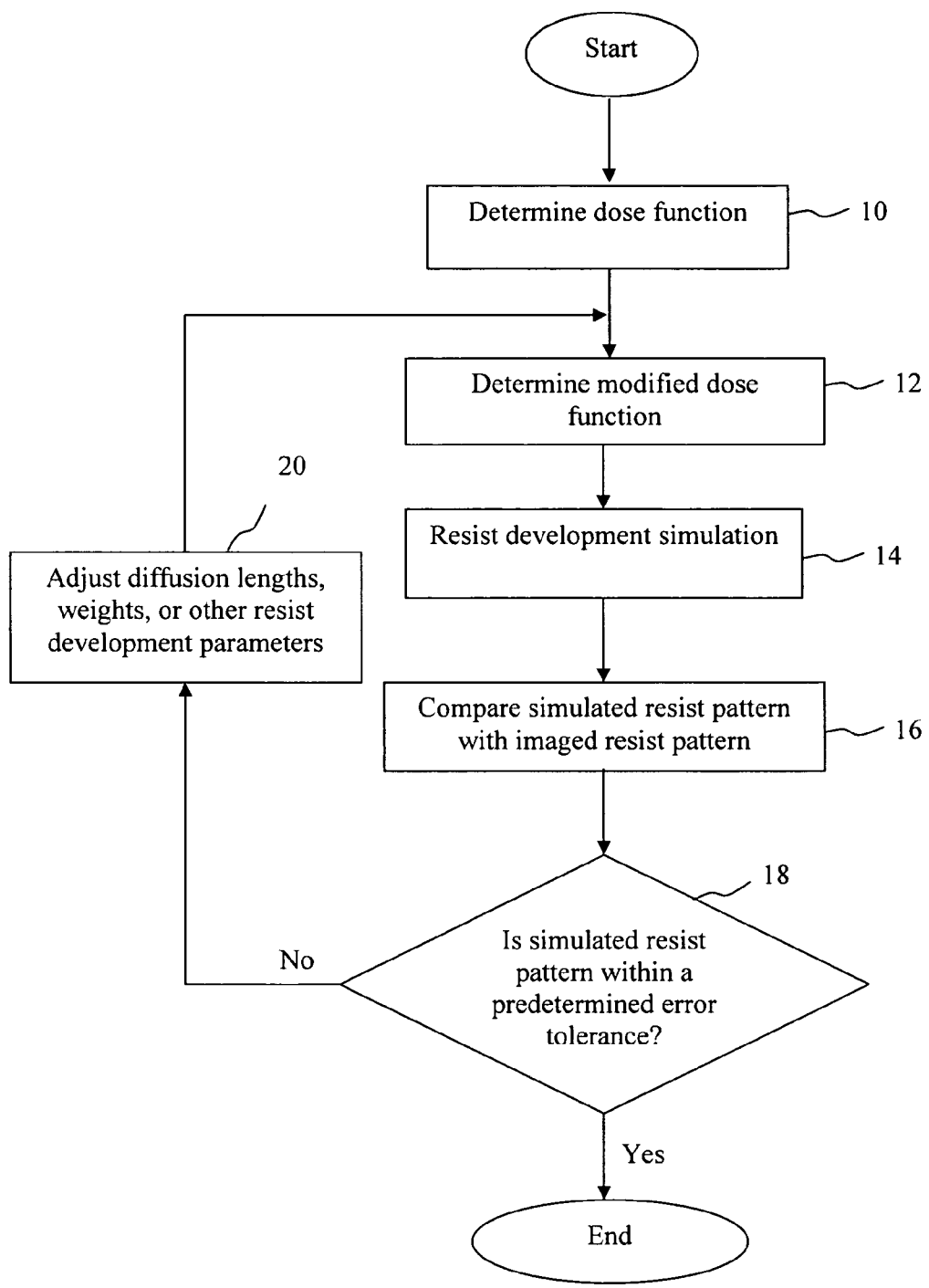

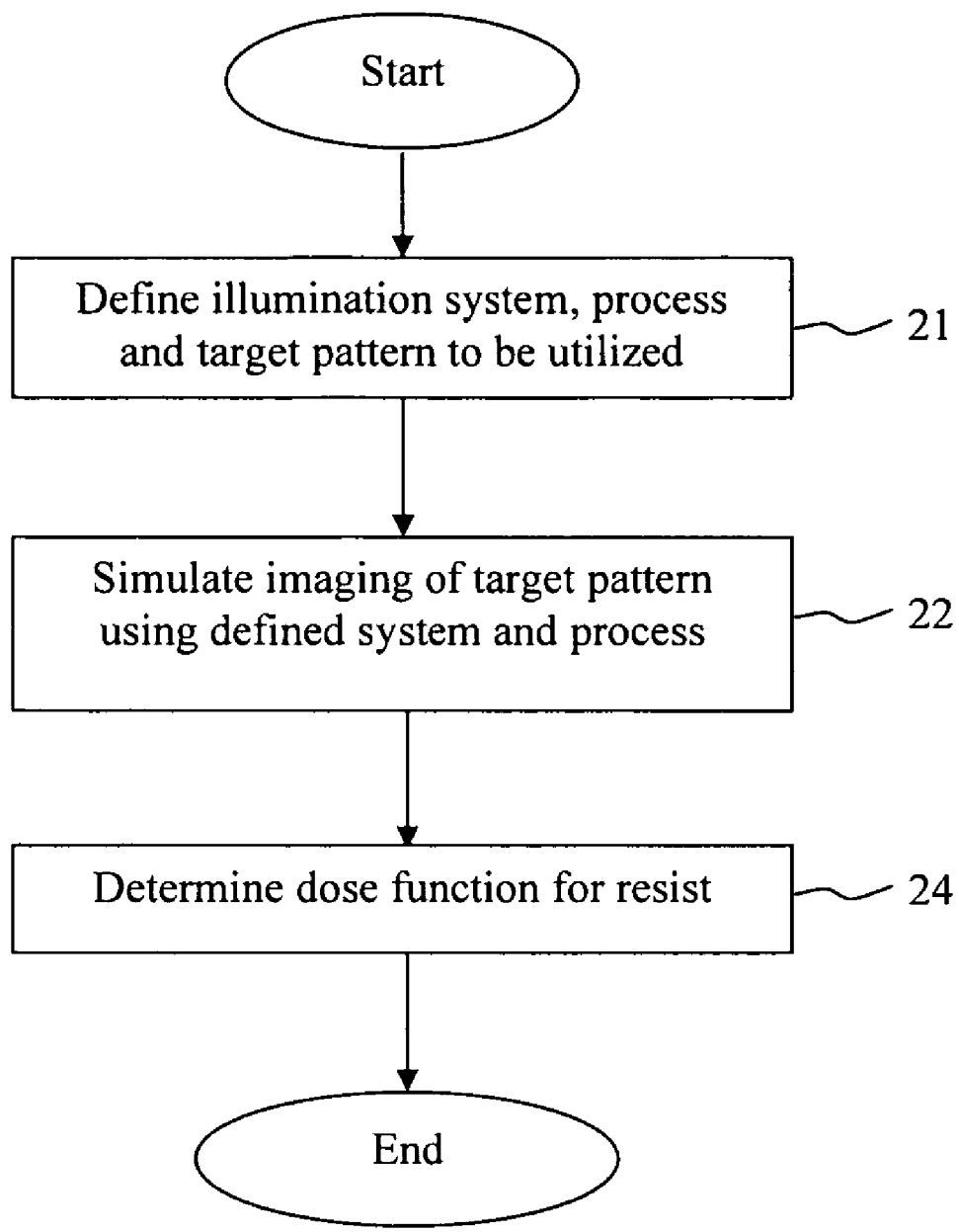

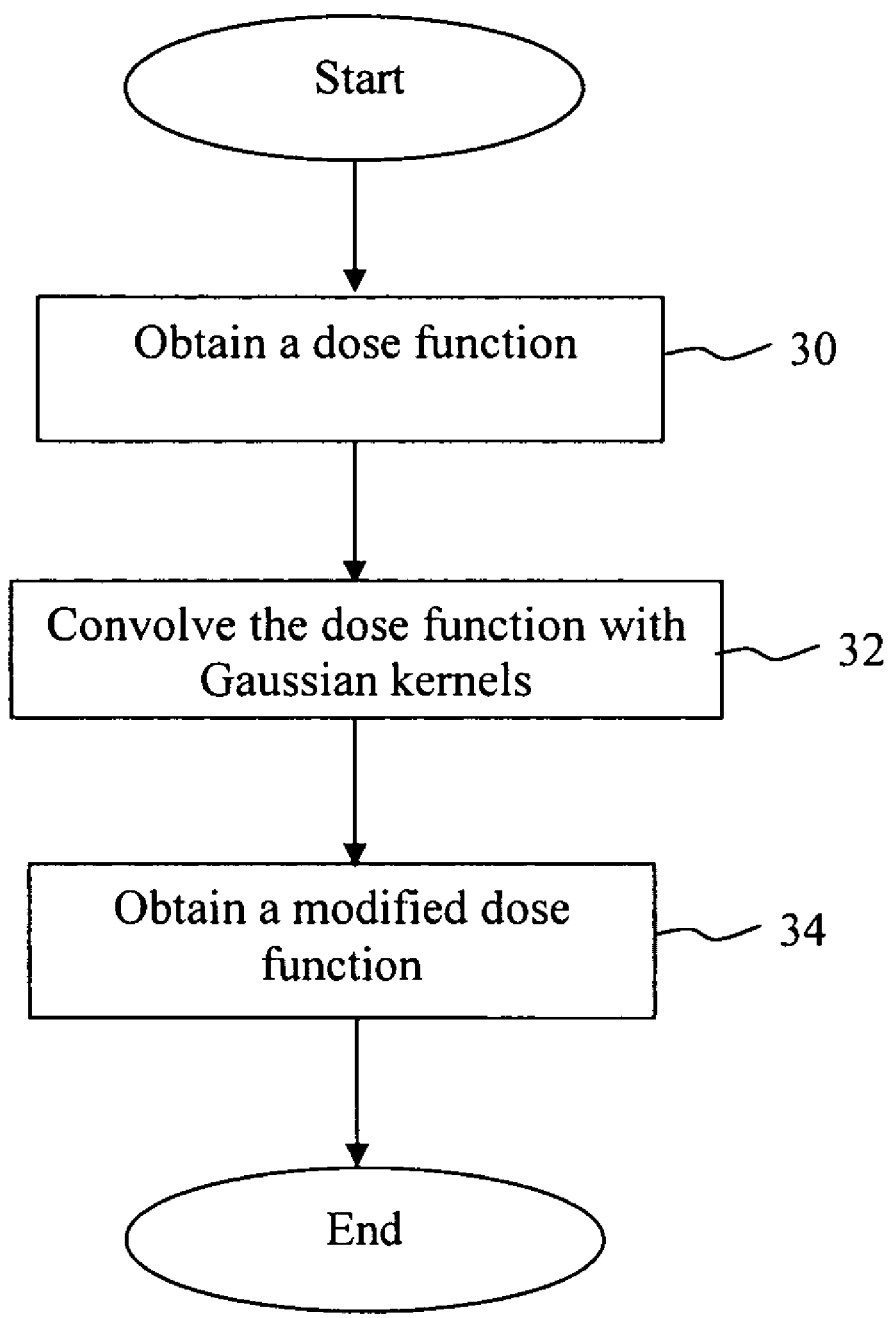

METHOD, PROGRAM PRODUCT AND APPARATUS FOR IMPROVING CALIBRATION OF RESIST MODELS USED IN CRITICAL DIMENSION CALCULATION

CLAIM OF PRIORITY

This patent application, and any patent(s) issuing therefrom, claims priority to U.S. provisional patent application No. 60/647,433, filed on Jan. 28, 2005, which is incorporated herein by reference in its entirety.

TECHNICAL FIELD

This disclosure relates generally to calibration of a resist model used in critical dimension calculation for use, for example, in simulation methods and programs, and more particularly, to calibration using a resist calibration model including Gaussian kernels with different diffusion lengths in different directions.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

When under very low $k_1$ lithography imaging, where $k_1 < 0.35$, and $k_1$ is defined as follows: $k_1 = 0.5*$(Feature pitch)$*$(Numerical Aperture)/(Exposure Wavelength), this is equivalent to pattern IC design at below one-half to one-third of the exposure wavelength ($\lambda$). For ArF exposure source, at $\lambda=193$ nm, the lithography process requires to pattern 90 nm to 65 nm IC features.

Nowadays, to develop a practical lithographic resist process, it is normally first done with using a lithography simulation tool for process optimization. Subsequently, actual wafer printing verification is performed. This helps expedite the develop cycle, reduce the cost, and allow more robust and well-controlled optimization to be performed via simulation. The challenge is how to ensure a resist CD to be predicted with sufficient accuracy when using the simulation tool. Resist model calibration is one of the critical key factors in the simulation process, and the robustness of the simulation model is another important factor.

In a typical lithography simulation, there are three basic steps. The first step is to calculate an aerial image for the feature in question. The aerial image calculation is based on the optical settings of an exposure tool, which include, for example, numerical aperture, exposure wavelength, etc. The aerial image calculation can be performed using known simulation tools, such as MaskTools' LithoCruiser™.

The second step is to perform a post exposure bake (PEB) step. In actual wafer printing where chemically amplified photoresist is used, this step is very important. The step provides two functions: (1) allowing chemical amplification for photo speed to take place due to the heat, and (2) minimize resist CD swing as caused by standing wave effects, this is done by diffusing photo acid generated during the exposure. A diffusion length or range can be in the range from 0 to 50 nm or more.

The third step is to develop a resist pattern based on the diffused aerial image.

For the second and third steps, basically two approaches have been established for lithography simulation. One is to use a first principle PEB model which is followed by another first principle resist develop model. The first principle model had first been proposed by Dill et al. in 1975. In mid 1980's, Lin and Mack separately proposed another form of resist development model, or lumped parameter models (LPM). The approach is to model pattern formation of the photoresist as a lumped parameter system. In a LPM, the resist CD is calculated based on photoresist characteristics such as contrast (gamma), thickness, image threshold, and development rate, etc. For simulation prediction, a LPM resist development model typically convolves with a simplistic diffusion function or kernel. This is essentially to emulate the PEB effect.

The photo resist simulation models based on the first principle is typically much more computationally demanding in terms of calculation. However, notwithstanding the use of such models, it is still difficult to fully account for exactly what occurs during PEB and resist development step. For modern resist systems, it is extremely difficult to use a generic model to represent exactly the chemical reaction behavior for different photoresist formulation. The first principle model suffers from the following drawbacks when it comes to very low $k_1$ imaging: less than satisfactory resist critical dimension (CD) prediction, and prolonged calculation time due to more complicated equations.

The LPM for resist CD prediction can be very fast with respect to processing time because fewer numbers of lumped parameters are required for the calculation. Traditionally, the industry's impression has been that the resist CD prediction is less accurate due to lumped and often much simplified parameters being utilized. In recent years, however, due to the difficulty to timely develop resist formulation specific physical models; more attention has been given to the LPM for improved accuracy. One key is to convolve the LPM with a sophisticated linear diffusion function or kernel. In the past, the linear diffusion kernel is single Gaussian function with a given width.

Brunner et al. has proposed sub-nm precision CD prediction that is comparable or better than the physical resist models in an article T. Brunner et al., Impact of resist blur on MEF, OPC and CD control, 2004 SPIE conference, 2004, the entirety of which is incorporated herein by reference. In Brunner's work, the use of multiple Gaussian diffusion kernels with the same diffusion lengths in different directions ("circular form," or "spherical form" when considered in 3-dimension, see FIG. 4A) has been considered as image "blur" functions, or the modulation transfer functions (MTF). As explained by Brunner, tuning the lengths for each of Gaussian kernels, or the respective MTF's, as a means of calibration, accurate resist CD can be predicted together with a subsequent LPM.

However, in Brunner et al., the Gaussian diffusion kernels utilized in the simulation process all have the same diffusion lengths in the different directions ("circular form," or "spherical form"). As explained further below, this leads to limitations in resist CD calibration. It is one object of the present invention to provide a simulation process which overcomes these limitations.

SUMMARY

This disclosure relates to a method, computer product and apparatus for calibrating a resist model used in critical dimension (CD) calculation. In accordance with the simulation process of the present invention, a dose function indicating the amount of energy in a resist is obtained based on optical tool to be used to form the resist on a wafer. The dose function is then convolved with a convolution kernel to obtain a modified dose function. Importantly, the convolution kernel may have variable diffusion lengths in each of the x, y and z directions.

The modified dose function is converted into a CD value which then may be compared with a target value. The diffusion lengths of the kernels may be adjusted based on the comparison result, if necessary, such that the simulated CD value obtained based on the modified dose function corresponds to the actual image results within some predefined error criteria.

The convolution kernel may includes multiple Gaussian kernels each having variable diffusion lengths in different directions. For example, the kernel utilized in this simulation process includes eight Gaussian kernels represented by the following equation:

$$WzW1\ G(Lx1, Ly1, Lz1; x,y,z) + WzW2\ G(Lx2, Ly1, Lz1; x,y,z) + WzW3\ G(Lx1, Ly2, Lz1; x,y,z) + Wz(1-W1-W2-W3)G(Lx2, Ly2, Lz1; x,y,z) + (1-Wz)W1\ G(Lx1, Ly1, Lz2; x,y,z) + (1-Wz)W2\ G(Lx2, Ly1, Lz2; x,y,z) + (1-Wz)W3\ G(Lx1, Ly2, Lz2; x,y,z) + (1-Wz)(1-W1-W2-W3)\ G(Lx2, Ly2, Lz2; x,y,z),$$

where Lx1, Ly1 and Lz1 are a first set of diffusion lengths in x, y and z directions, respectively, and Lx2, Ly2 and Lz2 are a second set of diffusion lengths in x, y and z directions, respectively, and W1, W2, W3 and Wz are weights. Weights W1, W2, W3 and Wz may be non-negative, weights W1, W2 and W3 are bounded by 1, and weight Wz is also bounded by 1. Importantly, as noted above, the diffusion lengths, x, y and z, can be different from one another in a given Gaussian kernel and each of the Gaussian kernels.

Since each Gaussian kernel has variable diffusion lengths in different directions, the CD predictability can be enhanced especially when 2 or 3 dimensional feature/resist patterns are predicted under very low $k_1$ imaging condition. Independent, but normalized sum of Gaussian length tuning for X, Y, and Z directions is possible. As a result, flexibility in terms of resist CD calibration can be achieved.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

The invention itself, together with further objects and advantages, can be better understood by reference to the following detailed description and the accompanying drawings.

BREID DESCRIPTION OF THE DRAWINGS

FIG. 1 is an exemplary flowchart illustrating the method of calibrating a resist model used in critical dimension (CD) calculation in accordance with an embodiment of the present invention.

FIG. 2 is an exemplary flowchart illustrating the process of simulating a dose profile in step 10 of FIG. 1.

FIG. 3 is an exemplary flowchart illustrating the process of obtaining a modified dose function in step 12 of FIG. 1.

Figure 11:
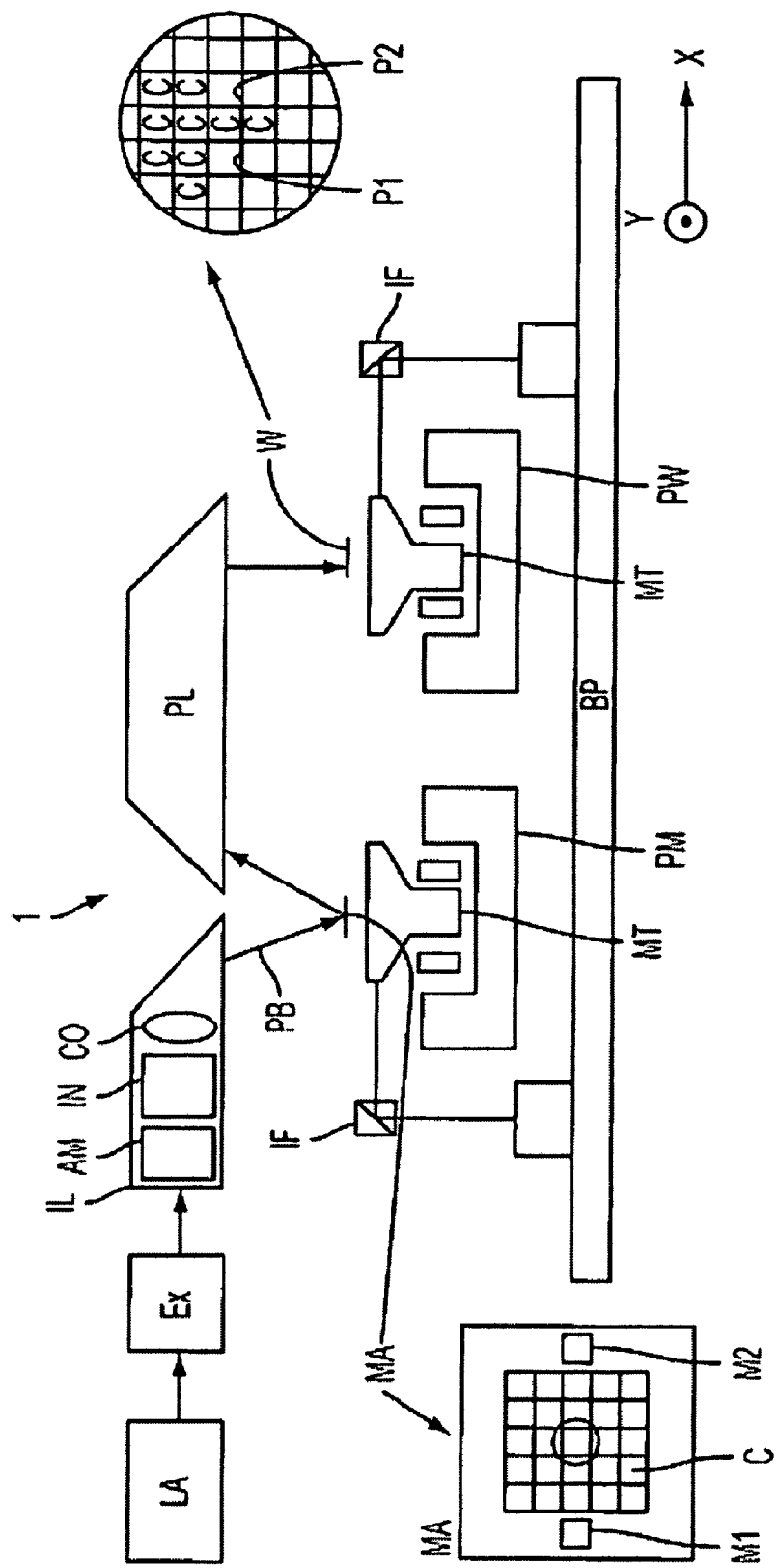

FIG. 11 schematically depicts a lithographic projection apparatus suitable for use with a mask designed with the aid of an embodiment of the present invention.

DESCRIPTION

As stated above, in accordance with the simulation process of the present invention, using a convolution kernel consisting of a sum of Gaussian kernels, each having different diffusion lengths in different directions to compute the resist performance enhances resist CD calibration. Furthermore, the use of multiple Gaussian kernels allow for improved precision and better calibration.

FIG. 1 is an exemplary flowchart illustrating basic steps of calibrating a resist used in critical dimension (CD) calculation in accordance with an embodiment of the present invention. The first step in the process, step 10, is to generate a dose function. The dose function can be generated utilizing known lithography simulation technologies/programs, such as MaskTools' LithoCruiser™. As is well known, the dose function is a function of the illumination system and process being utilized. The dose function represents the amount of energy within the resist on a point by point basis.

The second step in the simulation process, step 12, is to obtain a modified dose function by convolving the dose function with a convolution kernel. The next step, step 14, is to obtain a simulated resist pattern, e.g., a CD value or a 2- or 3-dimensional contour based on the modified dose function. Step 14 can be performed utilizing known development simulation tools, such as MaskTools' LithoCruiser™. At the end of step 14, simulated resist CDs or contours are available. When initially calibrating the simulation tool so as to determine the kernel to be utilized, the results of step 14 are compared to actual imaging results, which are performed utilizing the same system, process and target features utilized in the simulation process. If the simulated results match the actual results within some predefined error criteria, the simulation process is complete. However, if the simulated results fall outside the acceptable error range, the diffusion lengths and weights are adjusted and a new modified dose function is calculated. The new dose function is the utilized to compute the resulting simulating result pattern, and the comparison with the actual imaging process is performed again. This process continues until an acceptable modified dose function is determined. Steps 16, 18 and 20 of FIG. 1 illustrate this process. More specifically, in step 16, comparison between the simulated resist pattern and the actual resist pattern is performed. In step 18, if the simulated resist pattern is not within a predetermined tolerance, the process proceeds to step 20 so as to adjust diffusion lengths, weights, or other resist development paramenters of the Gaussian kernels. Steps 12-18 are repeated until the simulation result pattern is within a predetermined error tolerance. It is noted that the comparison process of the step can be performed utilizing sample CD measurements, and or 2- or 3-dimensional contours of the resist profiles.

FIG. 2 is an exemplary flowchart illustrating the process of simulating a dose function in step 10 of FIG. 1. An illumination system, process and target pattern to be utilized are defined (step 21). Then, imaging of the target pattern using the defined system and process is simulated (step 22) and a dose function for the resist is determined (step 24). The dose function represents the intensity of energy (i.e., dose) inside the resist at each point within the resist.

The process set forth in steps 21-26 are well known by persons skilled in the art. It is noted that both physical and empirical models may be utilized in the simulation process performed in steps 21-26.

FIG. 3 is an exemplary flowchart illustrating the process of obtaining a modified dose function in step 12 of FIG. 1. Generally, steps 30-34 generate the modified dose function from which the simulated resist CD value is obtained. Specifically, in step 30, the dose function is obtained from the step 26. For example, the dose function may be obtained from another simulator or computer. Then, the dose function is convolved with Gaussian kernels (step 32), and a modified dose function is obtained (step 34).

The Gaussian kernels to be convolved with the dose function will now be explained. A 1-dimensional Gaussian convolution kernel, with a fixed diffusion length L in an x direction, is represented by the following equation:

$$G(L; x) = \frac{1}{L\sqrt{2\pi}} e^{-x^2/2L^2}$$

A 3-dimensional Gaussian convolution kernel is represented as follows:

$$G(L,M,N;x,y,z) = G(L;x)G(M;y)G(N;z).$$

L, M and N indicate diffusion lengths corresponding to x, y and z directions, respectively. According to the 3-dimensional Gaussian convolution kernel, the diffusion lengths for x, y and z direction are not necessary the same after resist CD calibration optimization.

As discussed above, the dose function represents the intensity of energy inside the resist. Convolution of the dose function with the Gaussian kernels operates to smooth the intensity of energy within the resist. The diffusion lengths are mathematical properties of the Gaussian kernels which control the smoothing of the intensity of energy. A longer diffusion length means more smoothing of the intensity of energy within the resist. In the prior art, the same amount of smoothing the intensity of energy is performed in the x, y and z directions (see, FIG. 4B). On the other hand, in this embodiment, different amounts of smoothing the intensity of energy can be performed in the x, y and z directions, respectively (see, FIG. 4A). Specifically, the convolution of the dose function with the Gaussian kernels results in averaging the intensity of energy in the resist—averaging the dose at a point and doses nearby. The diffusion lengths of kernel represent how much the intensity of energy at each point in the resist is smoothed in each respective direction. Importantly, as noted above, in the given embodiment each of the three variables, x, y and z can have different diffusion lengths.

Figure 4A:
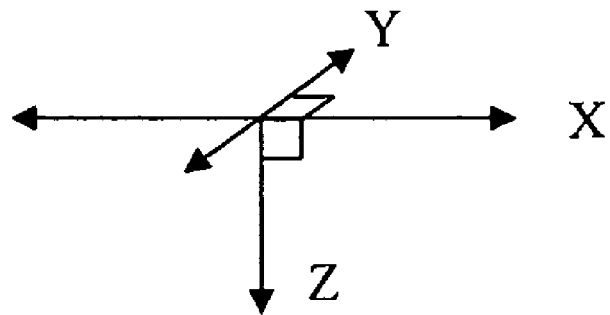
FIG. 4A is a schematic view exemplary illustrating diffusion lengths in x, y and z directions in accordance with an embodiment of the present invention.
Figure 4B:
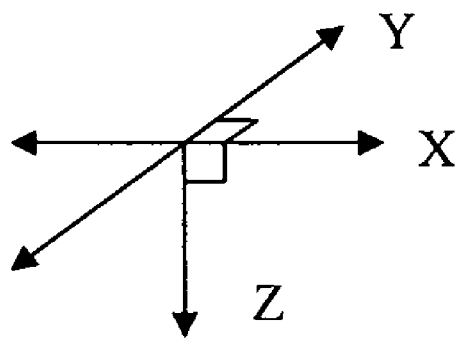
FIG. 4B is a schematic view exemplarily illustrating the same diffusion lengths in x, y and z directions used in the prior art simulations.

FIG. 4A is a schematic view exemplarily illustrating diffusion lengths in x, y and z directions according to an embodiment of the present invention. In contrast, FIG. 4B illustrates that the diffusion lengths for x, y and z are equal, which has been adapted by the prior art. The diffusion lengths may be set to be elliptical in this embodiment (because diffusion lengths can be set in different directions), whereas they can be set only to be circular in the prior art as explained with respect to Brunner's work (because the same diffusion lengths are used in different directions).

Moreover, the given embodiment of the present invention may use more than one Gaussian kernel. For example, more than one Gaussian kernel may make it possible to do a lot of smoothing and a little smoothing at the same time. In other words, the dose function may be convolved with a Gaussian kernel with a small diffusion lengths, which provides not so much smoothing. At the same time, the dose function may also be convolved with another Gaussian kernel with long diffusion lengths, which provides a lot of smoothing. The relative influence of those two convolutions can be changed, as required.

In the given embodiment, the following Gaussian kernel which is the weighted sum of eight Gaussians is utilized. Convolution may be performed by a simulator, such as, MaskTools' LithoCruiser™.

WzW1 G(Lx1, Ly1, Lz1, x,y,z)+WzW2 G(Lx2, Ly1, Lz1, x,y,z)+WzW3 G(Lx1, Ly2, Lz1, x,y,z)+Wz(1−W1−W2−W3)G(Lx2, Ly2, Lz1, x,y,z)+(1−Wz)W1 G(Lx2, Ly1, Lz2, x,y,z)+(1−Wz)W2 G(Lx2, Ly1, Lz2, x,y,z)+(1−Wz)W3 G(Lx1, Ly2, Lz2, x,y,z)+(1−Wz)(1−W1−W2−W3)G(Lx2, Ly2, Lz2, x,y,z)

In the foregoing Gaussian kernels, there are six diffusion lengths Lx1, Lx2, Ly1, Ly2, Lz1 and Lz2 (x, y and z directions each have two diffusion lengths in this example (not limited to two diffusion lengths for each direction)), and four non-negative weights W1, W2, W3 and Wz. The first three weights have a sum bounded by 1, and Wz is the relative weight of the z direction, which is also bounded by 1. These parameters are determined and optimized during the calibration process (see, step 20 of FIG. 1).

As noted above, the diffusion length in the x, y and z directions may be initially selected by a program or predetermined at some initial values, which for example, a lithography engineer may expect to provide acceptable results. However, once the calibration process is begun, the process operates to determine the optimal values for the diffusion lengths in the manner noted above.

As noted, the convolution of the dose function with the kernel results in a modified dose function. The modified dose function represents a smoothed intensity of energy inside the resist. It is noted that once the modified dose function is optimized, the modified dose function can then be utilized to accurately simulate various mask patterns using the given illumination system and process.

It is noted that in order to convolve a function with a Gaussian, the function must be defined on the set of all real numbers. If the function is only defined on a finite subset of the real numbers, the definition needs to be extended beyond the original subset.

There are two standard approaches to consider boundary conditions: 1) periodic extension; and 2) constant Extension.

The periodic extension can be performed efficiently in Fourier space since the Fourier transform turns convolution into multiplication and turns a Gaussian in real space into a similar Gaussian in Fourier (frequency) space. The constant extension assumes that leftmost and rightmost function values extend infinitely. The constant extension is conceptually simple but not as efficient. For horizontal diffusion, since it is assumed that a mask is periodic, each horizontal plane within the resist is also periodic. Thus, the plane can be tiled with identical copies of the resist image. Vertical diffusion may use a periodic extension of the resist with an inverted copy placed on top of it.

Figure 5:
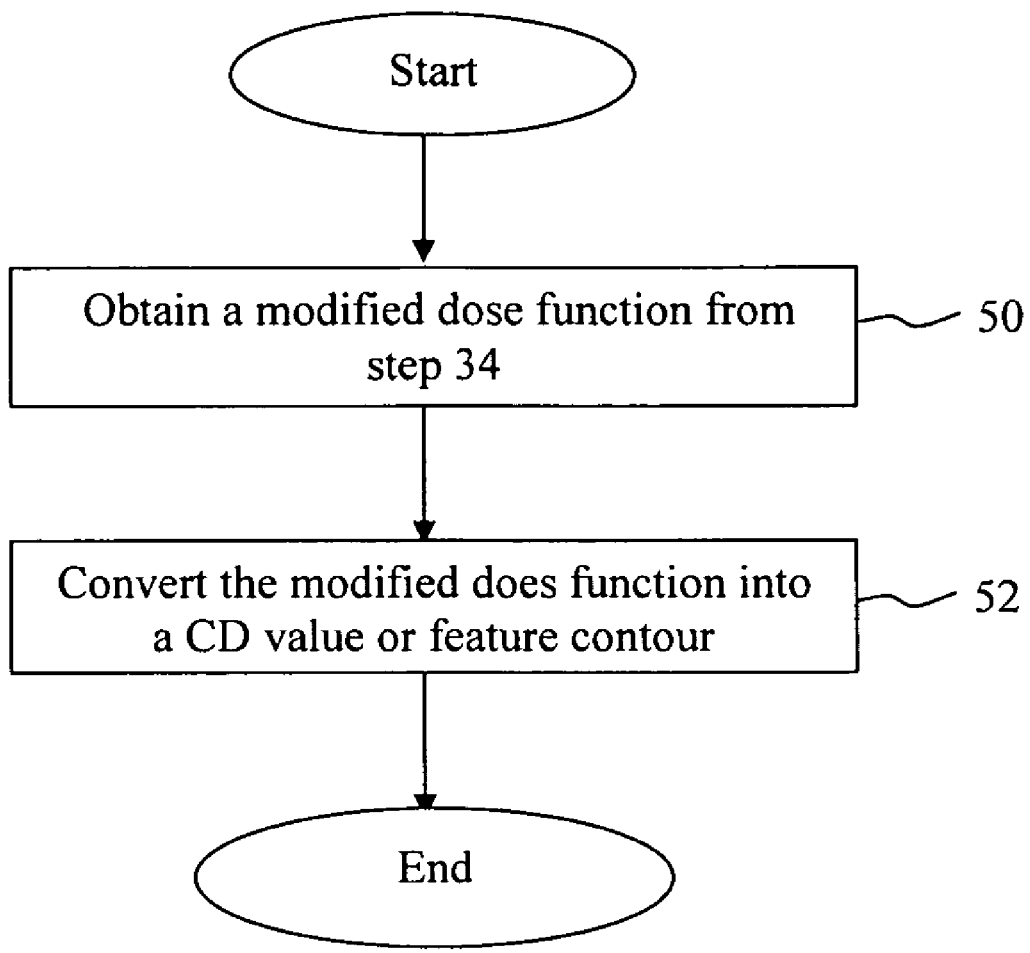
FIG. 5 is an exemplary flowchart illustrating the resist development simulation in step 14 of FIG. 1.

FIG. 5 is an exemplary flowchart illustrating steps of the resist development simulation in step 14 of FIG. 1. In the resist development simulation, the modified dose function is obtained (step 50), and converted into a CD value or a contour (step 52). This process can be performed utilizing known lithograph simulator tools, such as MaskTools' LithoCruiser™.

Returning to FIG. 1, as noted above, the CD value (or contour) obtained is compared with a target value (step 16). The target value is obtained by measuring an actual wafer. The actual wafer to be measured is prepared by use of the optical tools which was used to obtain the dose function. When the CD value is within a tolerance, i.e., equal to or close to the target value (step 18: yes), the CD calibration is completed. Once the best diffusion lengths are selected, those lengths can be used for any future simulations. On the other hand, when the CD value is not within the tolerance, the diffusion lengths in the kernel are adjusted (step 20). As mentioned above, the diffusion lengths in the x, y and z directions may be decided by a program based on the result of the comparison of the simulated CD value with the actual target value.

Performance verification examples will be explained. Conditions of example #1 are as follows: through pitch line/spaces, design CD 120 nm (actual ~70 nm), NA=0.80, ArF Resist 180 nm, BARC 60 nm, Silicon wafer, Quasar Illumination (0.8/0.56), Using vector high NA aerial image model, with unpolarized illumination, and MT1 (a type of LPM).

Figure 6:
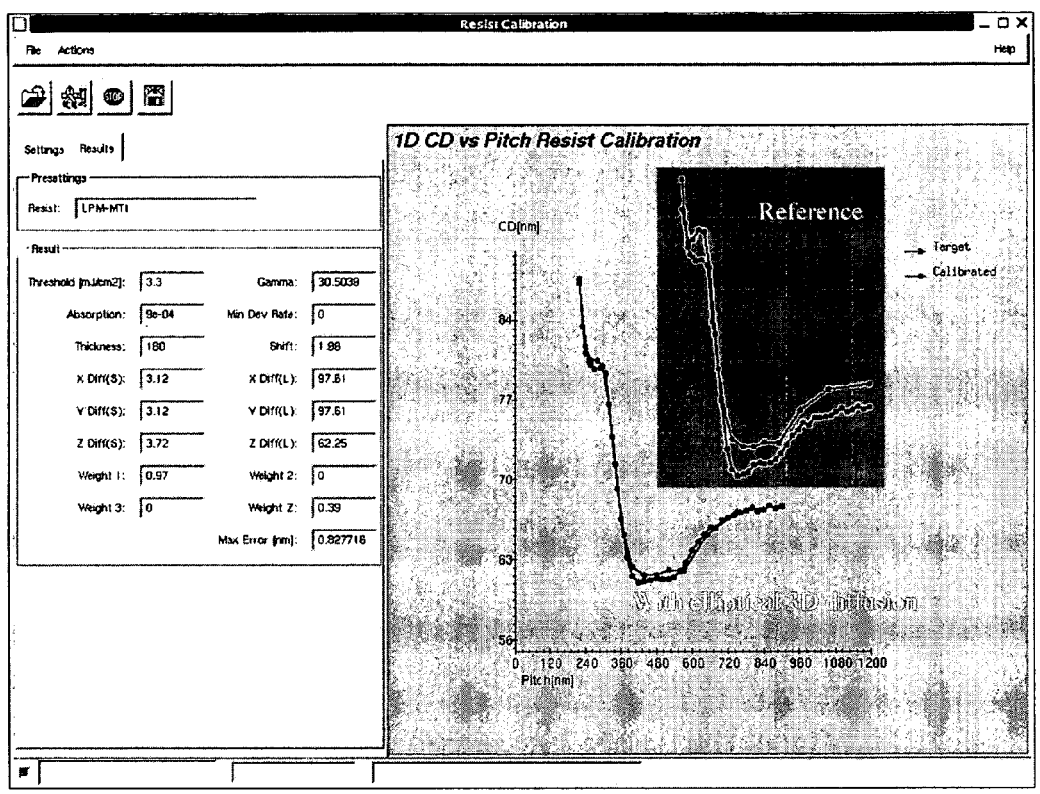
FIG. 6 is an exemplary graph illustrating through pitch CD calibration performance comparison according to an embodiment of the present invention.
Figure 7:
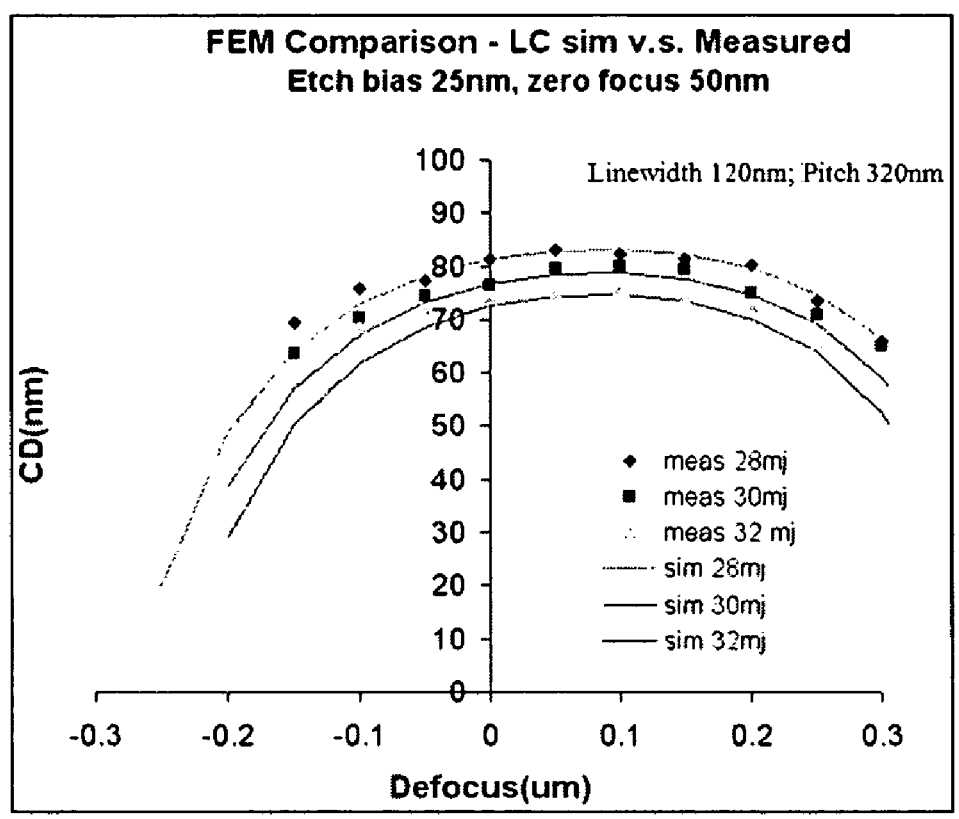
FIG. 7 is an exemplary graph illustrating use of a calibrated model to predict a resist CDs through focus and exposure (FEM) according to an embodiment of the present invention.

FIG. 6 shows an example of through pitch CD calibration performance comparison and FIG. 7 illustrates an example of using the calibrated model to predict the resist CDs through focus and exposure (FEM). As shown in FIGS. 6 and 7, excellent CD predictability can be obtained.

Conditions of example #2, which is 2D brick wall pattern, are as follows: Dark 6% AttPSM, NA=0.80, KrF, ArF resist 180 nm, BARC 60 nm, silicon wafer, customized c-quad (40X@1, 10Y@0.5, 0.97/0.72), resist 220 nm (fit 222 nm), BARC 40 nm (fit 16 nm), using vector high NA aerial image model, with unpolarized illumination, and MT1 (a type of LPM).

Figure 8:
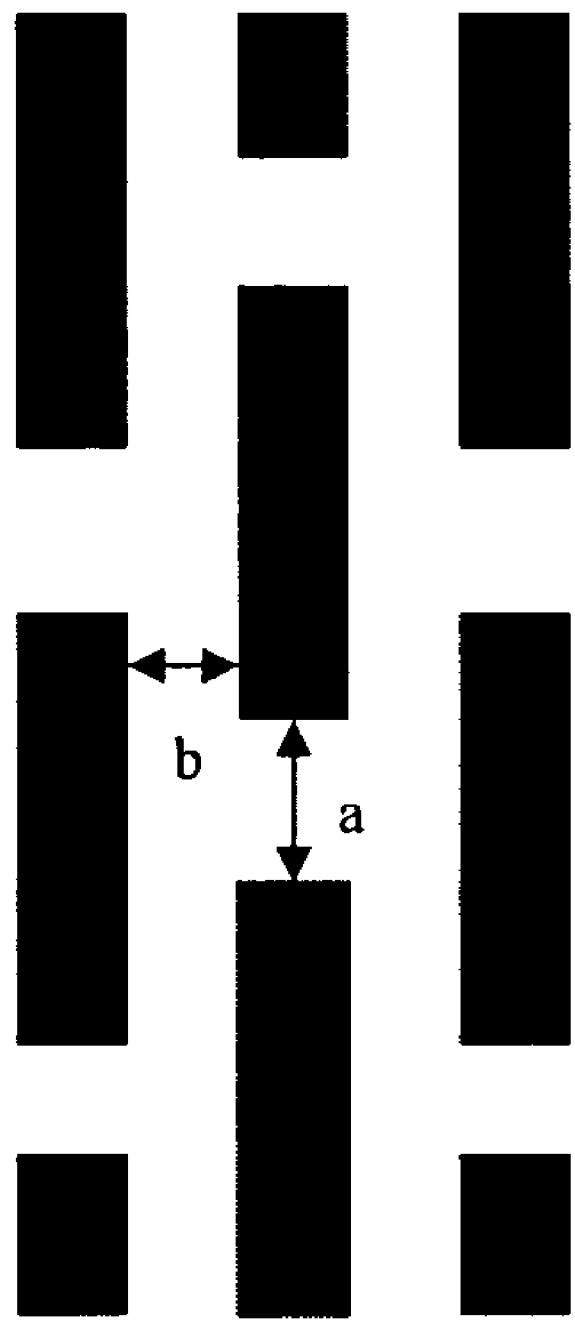
FIG. 8 is an example of a brick wall pattern to be used to obtain calibration results both with an embodiment of the present invention and a prior art technique.
Figure 9A:
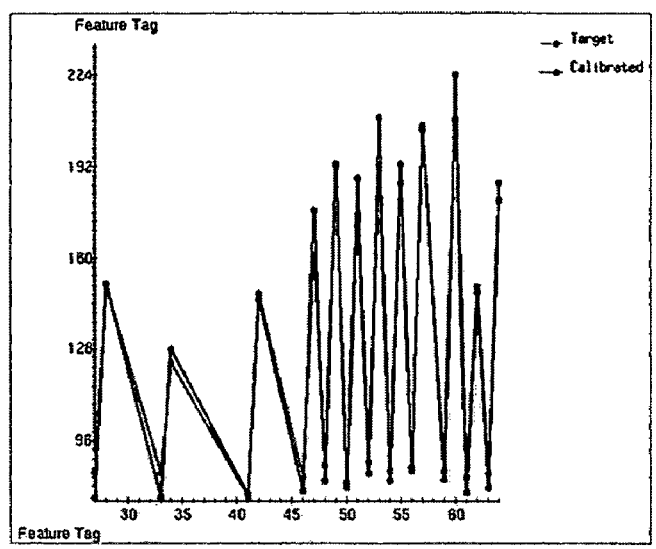
FIG. 9A is an example of calibration results according to an embodiment of the present invention.
Figure 9B:
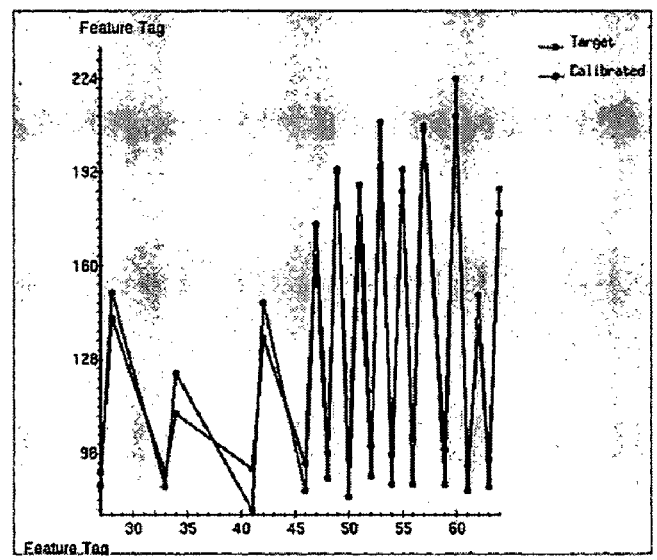
FIG. 9B is an example of calibration results obtained with a prior art technique.

FIG. 8 is an example of a brick wall pattern in which two CD sites are identified—a and b. 12 of such brick wall patterns are used for the resist CD calibration. For each brick wall pattern, the "drawn" CDs corresponding to for site a and site b are slightly different. The calibration results are shown in FIGS. 9A and 9B. FIG. 9A is an example of the calibration results obtained according to this embodiment, and FIG. 9B is an example of the results obtained with a prior art technique (traditional spherical Gaussian). Much better matching with a target can be seen for the results with this embodiment. Vertical axis is the CD and the horizontal refers to the site a and b for each of the 12 brick wall patterns.

Figure 10:
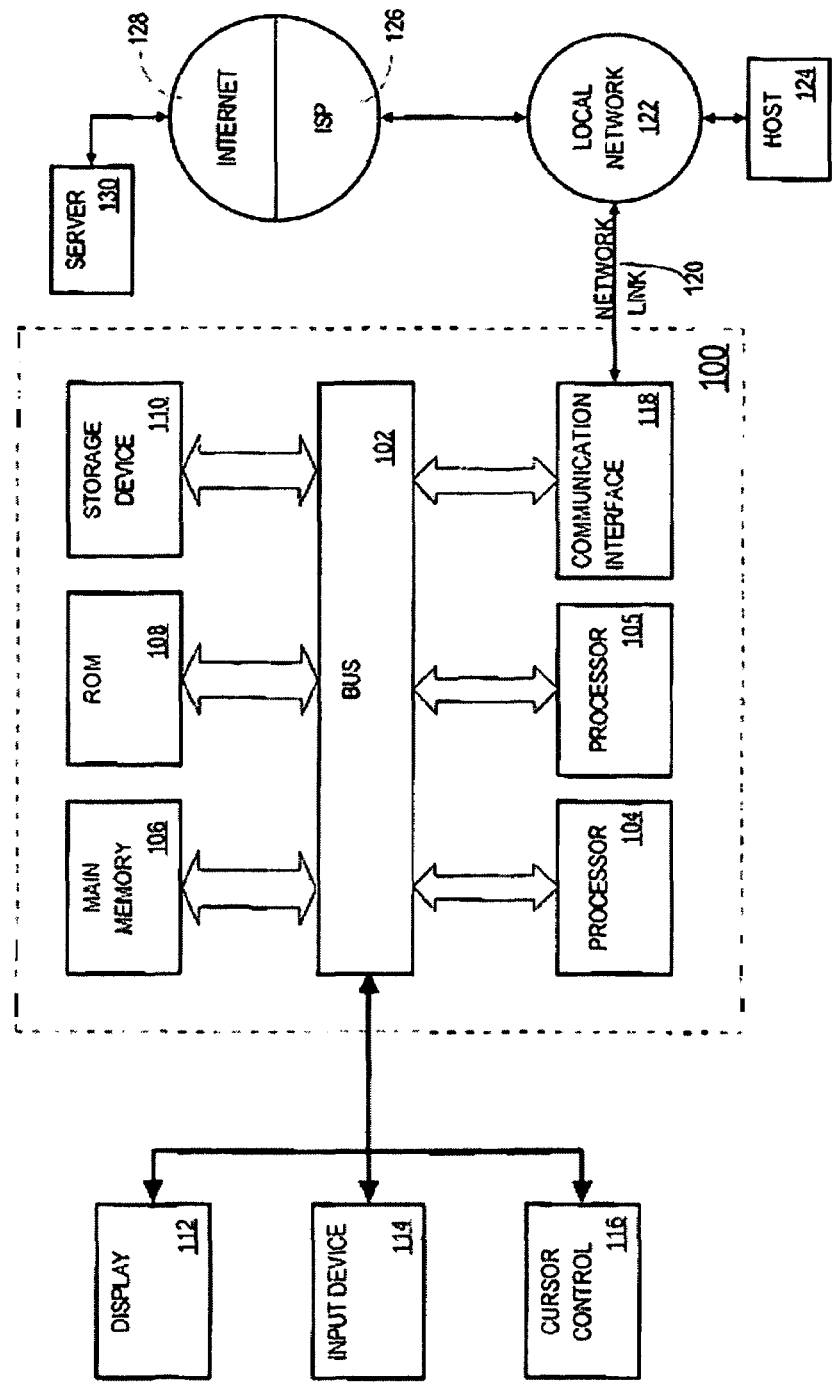
FIG. 10 is a block diagram that illustrates a computer system 100 which can implement a CD calibration according to an embodiment of the present invention.

FIG. 10 is a block diagram that illustrates a computer system 100 which can implement the CD calibration explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 1041. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e. g., x) and a second axis (e. g., y), that allows the device to specify positions in a plane. A touch panel (screen) display may also be used as an input device.

According to one embodiment of the invention, the CD calibration may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the convolution of a dose function with a Gaussian kernel, for example. The received code may be executed by processor 104 as it is received, and/or stored in storage device 110, or other non-volatile storage for later execution. In this manner, computer system 100 may obtain application code in the form of a carrier wave.

FIG. 11 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 11 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for calibrating a resist model used in critical dimension (CD) calculation, comprising the steps of:
    obtaining a dose function indicating the amount of energy in a resist based on optical tool to be used to form the resist on a wafer; and
    convolving the dose function with a convolution kernel to obtain a modified dose function, the convolution kernel having variable diffusion lengths in different directions.

2. The method according to claim 1, further comprising:
    converting the modified dose function into a CD value;
    comparing the CD value with a target value; and
    adjusting the diffusion lengths of the convolution kernel based on the comparison result.

3. The method according to claim 1, wherein the convolution kernel includes multiple Gaussian kernels each having variable diffusion lengths in different directions.

4. The method according to claim 3, wherein the convolution kernel includes eight Gaussian kernels represented by the following equation:

$$WzW1\ G(Lx1, Ly1, Lz1; x,y,z) + WzW2\ G(Lx2, Ly1, Lz1; x,y,z) + WzW3\ G(Lx1, Ly2, Lz1; x,y,z) + Wz(1-W1-W2-W3)G(Lx2, Ly2, Lz1; x,y,z) + (1-Wz)W1\ G(Lx1, Ly1, Lz2; x,y,z) + (1-Wz)W2\ G(Lx2, Ly1, Lz2; x,y,z) + (1-Wz)W3\ G(Lx1, Ly2, Lz2; x,y,z) + (1-Wz)(1-W1-W2-W3)G(Lx2, Ly2, Lz2; x,y,z),$$

where Lx1, Ly1 and Lz1 are a first set of diffusion lengths in x, y and z directions, respectively, and Lx2, Ly2 and Lz2 are a second set of diffusion lengths in x, y and z directions, respectively, and W1, W2, W3 and Wz are weights.

5. The method according to claim 4, wherein
weights W1, W2, W3 and Wz are non-negative,
weights W1, W2 and W3 are bounded by 1, and
weight Wz is bounded by 1.

6. A computer program product having a computer readable medium bearing a computer program for calibrating a resist model used in critical dimension (CD) calculation, the computer program, when executed, causing a computer to perform the steps of:
    obtaining a dose function indicating the amount of energy in a resist based on optical tool to be used to form the resist on a wafer; and convolving the dose function with a convolution kernel to obtain a modified dose function, the convolution kernel having variable diffusion lengths in different directions.

7. The computer program product according to claim 6, further comprising the steps of:
converting the modified dose function into a CD value;
comparing the CD value with a target value; and
adjusting the diffusion lengths of the convolution kernel based on the comparison result.

8. The computer program product according to claim 6, wherein the convolution kernel includes multiple Gaussian kernels each having variable diffusion lengths in different directions.

9. The computer program product according to claim 8, wherein the convolution kernel includes eight Gaussian kernels represented by the following equation:

$$WzW1\ G(Lx1, Ly1, Lz1; x,y,z) + WzW2\ G(Lx2, Ly1, Lz1; x,y,z) + WzW3\ G(Lx1, Ly2, Lz1; x,y,z) + Wz(1-W1-W2-W3)G(Lx2, Ly2, Lz1; x,y,z) + (1-Wz)W1\ G(Lx1, Ly1, Lz2; x,y,z) + (1-Wz)W2\ G(Lx2, Ly1, Lz2; x,y,z) + (1-Wz)W3\ G(Lx1, Ly2, Lz2; x,y,z) + (1-Wz)(1-W1-W2-W3)G(Lx2, Ly2, Lz2; x,y,z),$$

where $Lx1$, $Ly1$ and $Lz1$ are a first set of diffusion lengths in x, y and z directions, respectively, and $Lx2$, $Ly2$ and $Lz2$ are a second set of diffusion lengths in x, y and z directions, respectively, and $W1$, $W2$, $W3$ and $Wz$ are weights.

10. The computer program according to claim 9, wherein weights $W1$, $W2$, $W3$ and $Wz$ are non-negative,
weights $W1$, $W2$ and $W3$ are bounded by 1, and
weight $Wz$ is bounded by 1.

11. An apparatus for calibrating a resist model used in critical dimension (CD) calculation, comprising:
a first unit configured for obtaining a dose function indicating the amount of energy in a resist based on optical tool to be used to form the resist on a wafer; and
a second unit configured for convolving the dose function with a convolution kernel to obtain a modified dose function, the convolution kernel having variable diffusion lengths in different directions.

12. The apparatus according to claim 11, further comprising:
a third unit configured for converting the modified dose function into a CD value;
a fourth unit configured for comparing the CD value with a target value; and
a fifth unit configured for adjusting the diffusion lengths of the convolution kernel based on the comparison result.

13. The apparatus according to claim 11, wherein the convolution kernel includes multiple Gaussian kernels each having variable diffusion lengths in different directions.

14. The apparatus according to claim 13, wherein the convolution kernel includes eight Gaussian kernels represented by the following equation:

$$WzW1\ G(Lx1, Ly1, Lz1; x,y,z) + WzW2\ G(Lx2, Ly1, Lz1; x,y,z) + WzW3\ G(Lx1, Ly2, Lz1; x,y,z) + Wz(1-W1-W2-W3)G(Lx2, Ly2, Lz1; x,y,z) + (1-Wz)W1\ G(Lx1, Ly1, Lz2; x,y,z) + (1-Wz)W2\ G(Lx2, Ly1, Lz2; x,y,z) + (1-Wz)W3\ G(Lx1, Ly2, Lz2; x,y,z) + (1-Wz)(1-W1-W2-W3)G(Lx2, Ly2, Lz2; x,y,z),$$

where $Lx1$, $Ly1$ and $Lz1$ are a first set of diffusion lengths in x, y and z directions, respectively, and $Lx2$, $Ly2$ and $Lz2$ are a second set of diffusion lengths in x, y and z directions, respectively, and $W1$, $W2$, $W3$ and $Wz$ are weights.

15. The apparatus according to claim 14, wherein weights $W1$, $W2$, $W3$ and $Wz$ are non-negative,
weights $W1$, $W2$ and $W3$ are bounded by 1, and
weight $Wz$ is bounded by 1.

* * * * *